US008928820B2

(12) United States Patent
Coban et al.

(10) Patent No.: US 8,928,820 B2
(45) Date of Patent: Jan. 6, 2015

(54) TELEVISION TUNER TO CAPTURE A CABLE SPECTRUM (71) Applicant: Silicon Laboratories Inc., Austin, TX (US)

(72) Inventors: Abdulkerim L. Coban, Austin, TX (US); Mustafa H. Koroglu, Austin, TX (US)

(73) Assignee: Silcon Laboratories Inc., Austin, TX (US)

( * ) Notice: Subject to any disclaimer, the term of this patent is extended or adjusted under 35 U.S.C. 154(b) by 21 days.

(21) Appl. No.: 13/799,351

(22) Filed: Mar. 13, 2013

(65) Prior Publication Data

US 2014/0267928 A1 Sep. 18, 2014

(51) Int. Cl.
H04N 5/50 (2006.01)
H04N 5/44 (2011.01)
H04N 21/426 (2011.01)
H04N 21/438 (2011.01)

(52) U.S. Cl.
CPC ....... H04N 21/4263 (2013.01); H04N 21/4383 (2013.01)
USPC ........... 348/731; 348/725; 348/729; 348/553; 455/187.1; 455/255

(58) Field of Classification Search
USPC ......... 348/731, 732, 725, 726, 729, 553, 554, 348/555; 455/191.1, 189.1, 190.1, 187.1, 455/255; 375/316; 331/46, 74
See application file for complete search history.

(56) References Cited

U.S. PATENT DOCUMENTS

| 4,654,884 | A | 3/1987 | Sakai et al. | |
|---|---|---|---|---|
| 6,925,291 | B2 * | 8/2005 | Pugel | 455/191.1 |
| 7,167,694 | B2 | 1/2007 | Khoini-Poorfard et al. | |
| 7,417,510 | B2 | 8/2008 | Huang | |
| 7,447,491 | B2 | 11/2008 | Khoini-Poorfard | |
| 7,978,735 | B2 | 7/2011 | Ezra et al. | |
| 8,063,997 | B2 * | 11/2011 | Lindstrom et al. | 348/731 |
| 8,145,170 | B2 | 3/2012 | Khoini-Poorfard et al. | |
| 8,145,172 | B2 | 3/2012 | Khoini-Poorfard et al. | |
| 8,548,037 | B1 | 10/2013 | Michel | |
| 2003/0133049 | A1 * | 7/2003 | Cowley et al. | 348/731 |
| 2004/0063410 | A1 * | 4/2004 | Pugel | 455/191.1 |
| 2005/0266818 | A1 | 12/2005 | Johnson et al. | |
| 2007/0011719 | A1 | 1/2007 | Lin | |
| 2007/0242158 | A1 * | 10/2007 | Pugel | 348/554 |
| 2008/0315963 | A1 * | 12/2008 | Huang | 331/74 |
| 2010/0259333 | A1 * | 10/2010 | Fu et al. | 331/46 |
| 2010/0289967 | A1 | 11/2010 | Uchida | |
| 2011/0134337 | A1 * | 6/2011 | Takiguchi et al. | 348/731 |

(Continued)

OTHER PUBLICATIONS

U.S. Appl. No. 13/799,384, filed Mar. 13, 2013 entitled, "Multi-Tuner Using Interpolative Dividers," by Mustafa H. Koroglu, et al.

*Primary Examiner* — Jefferey Harold
*Assistant Examiner* — Jean W Desir
(74) *Attorney, Agent, or Firm* — Trop, Pruner & Hu, P.C.

(57) ABSTRACT

A method includes receiving a request to tune to a first desired television channel of a cable spectrum provided in a radio frequency (RF) signal received in a multi-tuner circuit configured to receive and process the entire cable spectrum, determining a channel of the channels including the first desired television channel, disabling the channels other than the determined channel, and processing the RF signal in the determined channel.

20 Claims, 7 Drawing Sheets

(56) References Cited

U.S. PATENT DOCUMENTS

| | | |
|---|---|---|
| 2011/0151816 A1 | 6/2011 | Wu et al. |
| 2011/0243563 A1 | 10/2011 | Salinger et al. |
| 2011/0244820 A1 | 10/2011 | Khoini-Poorfard et al. |
| 2012/0249888 A1 | 10/2012 | Naik et al. |
| 2012/0321012 A1 | 12/2012 | Elenes et al. |

* cited by examiner

TELEVISION TUNER TO CAPTURE A CABLE SPECTRUM

BACKGROUND

Televisions with multiple channel reception capabilities can provide desirable features such as picture-in-picture, recording one or more channels while watching another one, and fast channel switching time between a few adjacent channels or a few recently tuned channels. Typically, multiple tuners are provided to enable these capabilities. In general, these tuners are each implemented as a discrete tuner. While there have been efforts to implement a single tuner in a single semiconductor die integrated circuit (IC), it has proven difficult to incorporate more than one tuner on a single die, particularly in terms of area and power consumption, and performance issues.

Recently, implementation of single-chip multi-tuner solutions has gained interest, as it can be more cost and power efficient compared to multiple single chip tuner solutions. Solutions are typically based on directly digitizing the entire TV spectrum (e.g., 42 MHz to 1 GHz for the cable TV spectrum). These products are called full band capture or full spectrum capture devices. The core of the analog part of such devices is a very high-speed analog-to-digital (ADC) with a sampling clock frequency of 2 GHz-3 GHz that can potentially digitize the entire cable spectrum. A highly linear, typically off-chip, low noise amplifier (LNA) precedes the ADC. The ADC requires about 10-bits of resolution and 60 dB spurious frequency dynamic range (SFDR). In current technologies, design of an ADC that operates at such high bandwidth and dynamic range is quite challenging, therefore some amount of interleaving is typically employed (e.g., 2 to 64 channels). Key signal processing functions such as down conversion and blocker filtering are pushed to the digital domain in the full band capture device. In this way, information of all of the interleaved channels of the ADC is needed to process single desired channel. The processing burden of the digital section is further increased due to inter-channel calibration needs of the time-interleaved ADC.

SUMMARY OF THE INVENTION

In an embodiment, an apparatus includes a splitter to receive a radio frequency (RF) signal that provides a cable spectrum and to provide the RF signal to multiple channels each to process a band of a predetermined width of the cable spectrum. Each of the channels includes a first amplifier to amplify the RF signal, a bandpass filter fixed at a predetermined center frequency to pass the band of the predetermined width of the cable spectrum, a mixer to downconvert the amplified RF signal to a second frequency signal using a local oscillator (LO) signal, a second filter to filter the second frequency signal, and a digitizer to digitize the filtered second frequency signal.

The apparatus may further include, in an embodiment, a clock generation circuit having a frequency synthesizer to generate a reference clock signal, first dividers and interpolative dividers, where each of the first dividers is to generate a corresponding LO signal from the reference clock signal according to an integer ratio and to provide the corresponding LO signal to the mixer of at least one of the channels, and the interpolative dividers each to generate a corresponding LO signal from the reference clock signal according to a fractional ratio and to provide the corresponding LO signal to the mixer of at least one of the channels.

In an embodiment, the apparatus is a multi-tuner circuit configured on a single semiconductor die, and is configured to process and digitize the entire cable spectrum. A controller may cause at least one of the channels to be powered off when a desired channel is not within the band of the predetermined width of the given channel. Also, the controller may control a value of the LO signal output by each of the interpolative dividers to cause downconversion of the amplified RF signal to DC with a predetermined bandwidth, where a resolution of the interpolative divider is limited to cause spurs generated in the interpolative divider to be maintained away from the LO signal.

In another embodiment, a system includes an integrated circuit (IC) multi-tuner circuit having a first semiconductor die including a first tuner to receive and process a first band of a predetermined width of a cable spectrum provided in a RF signal to output a first digitized signal and a second tuner to receive and process a second band of a predetermined width of the cable spectrum provided in the RF signal to output a second digitized signal. In addition, the IC may include or be coupled to a clock generation circuit having a frequency synthesizer to generate a reference clock signal, a first divider and an interpolative divider. The first divider is configured to generate a corresponding LO signal from the reference clock signal according to an integer ratio and to provide the corresponding LO signal to a mixer of one of the first and second tuners, and the interpolative divider is configured to generate a corresponding LO signal from the reference clock signal according to a fractional ratio and to provide the corresponding LO signal to a mixer of the other of the first and second tuners.

In another embodiment, a method includes receiving a request to tune to a first desired television channel of a cable spectrum provided in the RF signal received in the multi-tuner circuit, determining a channel of the channels including the first desired television channel, disabling the channels other than the determined channel, and processing the RF signal in the determined channel.

DETAILED DESCRIPTION

In various embodiments a single chip multi-tuner solution is provided, where in many embodiments multiple tuners can be integrated on a single semiconductor die. Such designs are attractive as it can be more cost and power efficient compared to a solution where multiple single tuners or dual tuner chips are used. Embodiments may also enable reduced area and power per tuner, as more and more tuners are integrated into a single die or multi-chip module (MCM).

In various embodiments, the entire cable spectrum band (which is approximately 1 GHz) is split into a plurality of roughly equal frequency bands. Signal processing is performed in each band as if it were a single tuner. In a particular embodiment, a tuner includes 10 individual tuners, each configured to perform signal processing on a band of approximately 100 MHz. Of course, other examples are possible, and a multi-tuner architecture can include between approximately 5 to 20 (or any other number) individual tuners or channels, each configured to process a substantially equal bandwidth. In general, each tuner is configured to process a band having a width of full cable spectrum bandwidth/N where N is the number of tuners. Although the full cable spectrum bandwidth slightly varies across different cable TV standards, for the example above (spectrum covering 42 MHz to 1 GHz) each tuner processes about 958 MHz/N bandwidth. With a given tuner configured to process an approximate 100 MHz band (N=10), up to 17 information channels (e.g., television channels each of approximately 6 MHz bandwidth) are processed through the entire analog chain.

Since each wideband channel covers a fixed frequency band (e.g., 150 MHz to 250 MHz for channel 2), 100 MHz wide, fixed center frequency low-Q bandpass filters are provided instead of a tracking filter bank (as in a conventional TV tuner).

Figure 1:
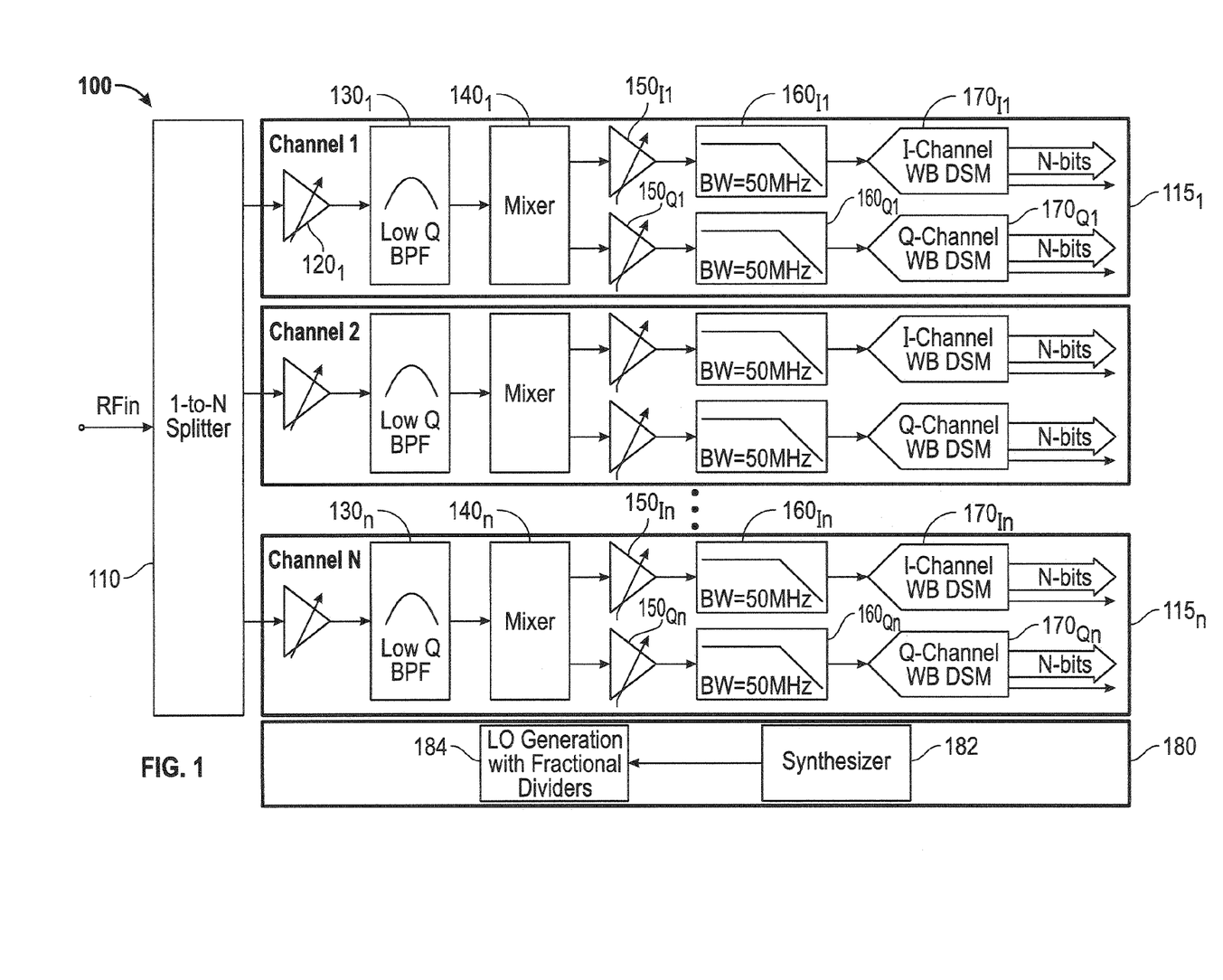
FIG. 1 is a block diagram of a multi-tuner architecture in accordance with an embodiment.

Referring now to FIG. 1, shown is a block diagram of a multi-tuner architecture in accordance with an embodiment. As shown in FIG. 1, tuner 100 is an N-channel tuner including N different channels $115_1$-$115_n$, each of which is configured to receive and process an incoming RF signal $RF_{IN}$. In this example, N is 10 such that the entire cable spectrum can be segmented into approximately 100 MHz chunks. Note that tuner 100 can be implemented on a single semiconductor die. As seen in FIG. 1, the incoming RF signal is provided to a splitter 110 that splits and provides the signal to each of the different channels. This RF signal may have been previously amplified by a LNA located off-chip or by an on-chip LNA (not shown in FIG. 1). For purposes of discussion herein, the components of a first channel, channel 1 ($115_1$), are described. Understand each channel may be configured similarly, although operating at a different frequency band. Each channel has a unique RF front end, with a bandpass filter centered around the frequency band processed. Mixers for each channel may also be different based on the harmonic rejection needs.

In the example shown in FIG. 1 as to the signal processing path of channel $115_1$, the RF signal is first provided to a variable gain amplifier (VGA) $120_1$. In turn, the amplified signal is provided to a bandpass filter (BPF) $130_1$. In various embodiments, BPF $130_1$ may be configured as a low quality factor (Q) filter. Q values are set progressively higher as the location of frequency bands increases (e.g., Q=1 for 50 MHz-150 MHz band whereas Q=10 for 850 MHz-950 MHz band, in an embodiment).

Because of the fixed center frequency, this band select filter can be implemented with a small footprint. Using fixed band select filters in each channel rather than more complex multiple tracking filters provides reduced area and power consumption. In addition, these fixed bandpass filters relax mixer linearity and dynamic range (DR) requirements. Also note that these front end bandpass filters are in contrast to a full band capture device, since the entire bandwidth must be preserved to be able to recover any desired channel in such a full band capture device.

The resulting filtered signal is then coupled to a mixer $140_1$ which may be configured as a quadrature mixer to downconvert the RF signal to a lower frequency signal (e.g., an IF signal). As will be described further below mixer $140_1$ is configured to mix the RF signal with a local oscillator (LO) signal received from a clock generation circuit 180, which in the embodiment of FIG. 1 includes a single frequency synthesizer 182. In addition, note that a clock generation circuit may include combinations of fixed ratio dividers and interpolative dividers 184. In an embodiment, each channel may be associated with a separate divider of clock generation circuit 180 that is used to divide a reference clock signal into a LO signal. Some of these dividers may be implemented as interpolative dividers. The use of interpolative dividers reduces number of channels (less frequency overlap due to better LO resolution). An additional benefit of using interpolative dividers is that it results in simplified LO generation for harmonic rejection mixers (HRMs) of the different channels. This is so, as an embodiment can include a fixed divide by 4 divider (or two divide by two dividers) after an interpolative divider. Using fractional dividers allows more uniformly generated LO locations.

After filtering, only a small portion of the cable spectrum is exposed to the following mixer, thereby relaxing its linearity and harmonic rejection requirements. In various embodiments, clock generation circuit 180 includes a combination of integer dividers and interpolative dividers each programmable to generate an LO signal for one or more corresponding channels of the tuner. In a specific embodiment, clock generation circuit 180 includes five identical UHF mixers with 4 phase LO and five HRM mixers for VHF frequencies. In other embodiments, fewer high-frequency dividers may be present than the number of channels N such that multiple channels may leverage a single high-frequency divider (to implement different divide ratios). For some channels, LO signals for lower band channels can be obtained by dividing the high-frequency divider output with additional integer dividers, which are inherently present in HRM mixers. Mixer LO generation is done using a single frequency synthesizer 182, which in embodiments may be 15.2 GHz reference clock signal generated by a VCO. In addition clock generation circuit 180 includes control circuitry such as a microcontroller unit (MCU) or other control logic.

Referring to Table 1, seen are divide ratios for another embodiment, in which 3 interpolative dividers (4.5, 5.75, and 6.625) are used, along with 2 high-frequency integer dividers (4 and 5). Final LO values for each channel are obtained by N (N=10 for this example) post high-speed interpolative or integer dividers.

TABLE 1

| $f_{vco}$ (GHz) | Int. Div. Ratio | Post Int. Div. Ratio | Total divN | $f_{min}$ (MHz) | $f_{center}$ (MHz) | $f_{max}$ (MHz) |
| --- | --- | --- | --- | --- | --- | --- |
| 15.2 | 4 | 4 | 16 | 897.0 | 950.0 | 1003.0 |
| 15.2 | 4.5 | 4 | 18 | 791.4 | 844.4 | 897.4 |
| 15.2 | 5 | 4 | 20 | 710.0 | 760.0 | 810.0 |
| 15.2 | 5.75 | 4 | 23 | 610.9 | 660.9 | 710.9 |
| 15.2 | 6.625 | 4 | 26.5 | 523.6 | 573.6 | 623.6 |
| 15.2 | 4 | 8 | 32 | 425.0 | 475.0 | 525.0 |
| 15.2 | 5 | 8 | 40 | 330.0 | 380.0 | 430.0 |
| 15.2 | 6.625 | 8 | 53 | 236.8 | 286.8 | 336.8 |
| 15.2 | 5 | 16 | 80 | 140.0 | 190.0 | 240.0 |
| 15.2 | 5 | 32 | 160 | 45.00 | 95.0 | 145.0 |

Still with reference to FIG. 1, the lower frequency output from mixer $140_1$ is provided to corresponding programmable gain amplifiers (PGAs) $150_{I1}$-$150_{Q1}$. The bandwidth of the IF chain is around 50 MHz to accommodate the entire 100 MHz frequency band (−50 MHz to 50 MHz). In turn, amplified signals may be provided to corresponding low pass filters $160_{I1}$-$160_{Q1}$. In an embodiment, the bandwidth of these filters may be approximately 50 MHz. The resulting filtered signals in turn may be provided to corresponding digitizers $170_{I1}$-$170_{Q1}$ which in an embodiment can be configured as continuous time (CT) delta sigma modulator analog-to-digital converters (ADCs). As continuous time ADCs rather than discrete time ADCs, the ADCs do not need stringent anti-aliasing filters. In addition, IF channels do not require any inter-channel calibration that would be needed in solutions incorporating time interleaved ADCs.

Embodiments may provide better performance than a full band capture tuner, in that since each ADC is exposed to only a portion of the full band (e.g., approximately 100 MHz), relaxed DR requirements are realized. Dynamic range can be relatively limited as within a given band, the strength of individual information channels does not significantly vary since the entire cable spectrum can have a relatively minimal power tilt (less than 20 dB) over the entire 1 GHz spectrum. Further, no inter-channel calibration is performed. In a particular embodiment a 65 dB dynamic-range 4th-order continuous-time (CT) delta-sigma ADC with a O-bit quantizer is used to digitize the signal. Note that the ADC choice is based on its area and power advantages as well as relaxed anti-aliasing requirements. Of course other ADC designs such as other CT delta-sigma ADCs may also be used (e.g., a third order loop with a higher clock frequency). No inter-channel calibration is required, as matching between channels is not critical as would be the case for a full band capture tuner based on a time-interleaved ADC.

The resulting digital outputs from the ADCs may be provided to further circuitry of a system. Although shown at this high level in the embodiment of FIG. 1, understand the scope of the present invention is not limited in this regard.

In certain embodiments, the channels for unused bands can be powered down, thereby saving power. For example the MCU or other control logic may perform these power control operations. In contrast, in a full capture system, there can be no powering down of any circuitry as the entire spectrum is needed to process a single channel as the information is spread across the entire spectrum. Higher linearity is achievable as compared to a time-interleaved design as CT delta-sigma ADCs have better SFDR characteristics.

Figure 2:
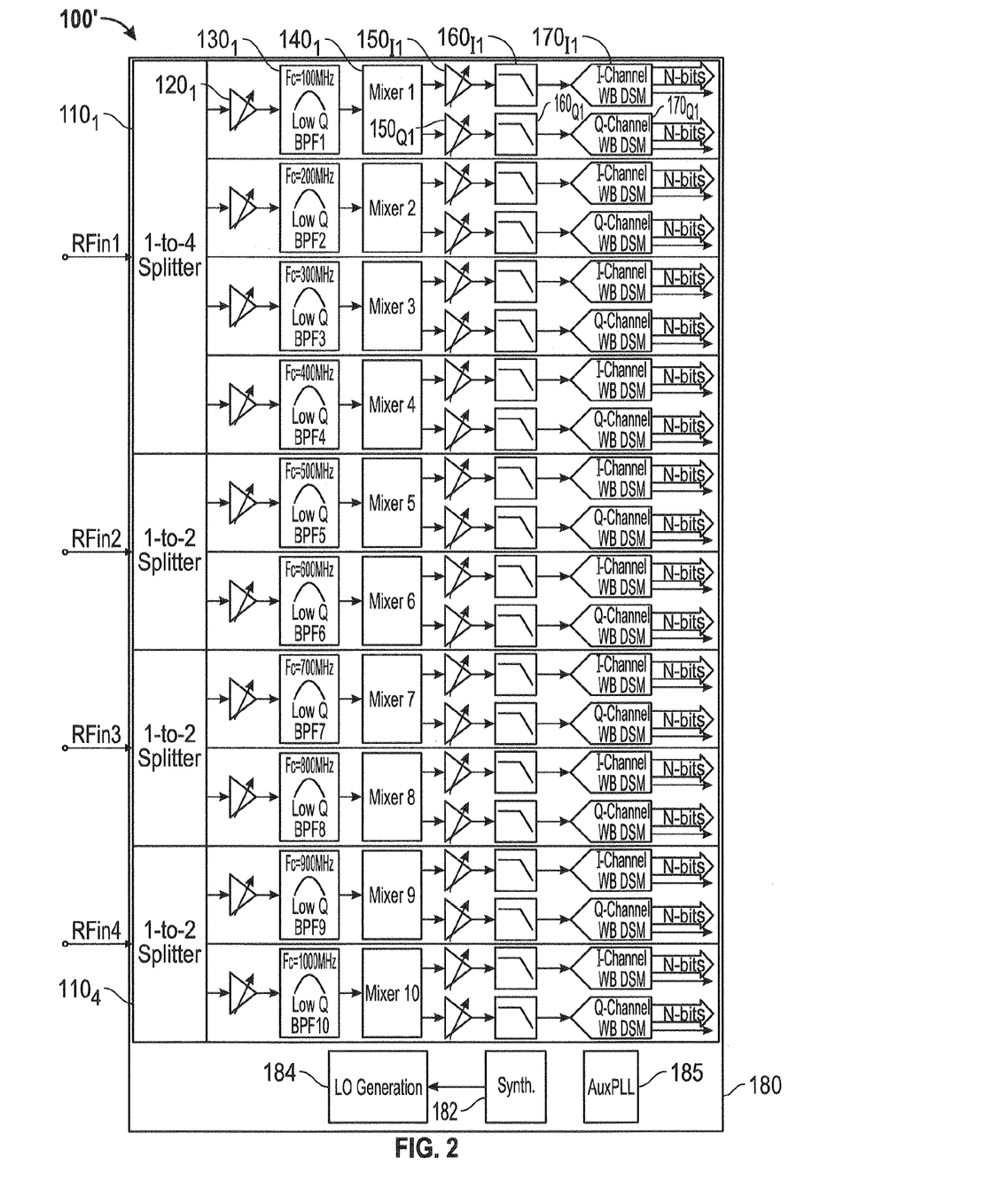
FIG. 2 is a block diagram of a multi-tuner architecture in accordance with another embodiment.

Note that in other embodiments, such as where a splitter may have insufficient fan out to provide acceptable levels of RF signals to each of the channels, multiple splitters may be present. Referring now to FIG. 2, shown is a block diagram of a multi-tuner architecture in accordance with another embodiment. In general, circuit 100' may be configured the same as discussed above with regard to FIG. 1. However, in this embodiment instead of a single splitter, a plurality of splitters are provided, namely splitters $110_1$-$110_4$. Each of these splitters is configured to provide the RF signal to multiple channels, as seen in FIG. 2. Note that the number of channels coupled to a given splitter may vary based on fan out. As seen, greater numbers of the lower frequency band channels can be coupled to a single splitter as it is easier to drive higher numbers of channels at lower frequencies (e.g., the four low channels coupled to splitter $110_1$). Also in the illustration of FIG. 2, an auxiliary PLL 185 is present, which may be used to provide sampling clock signals to the ADCs of each of the channels.

Figure 3:
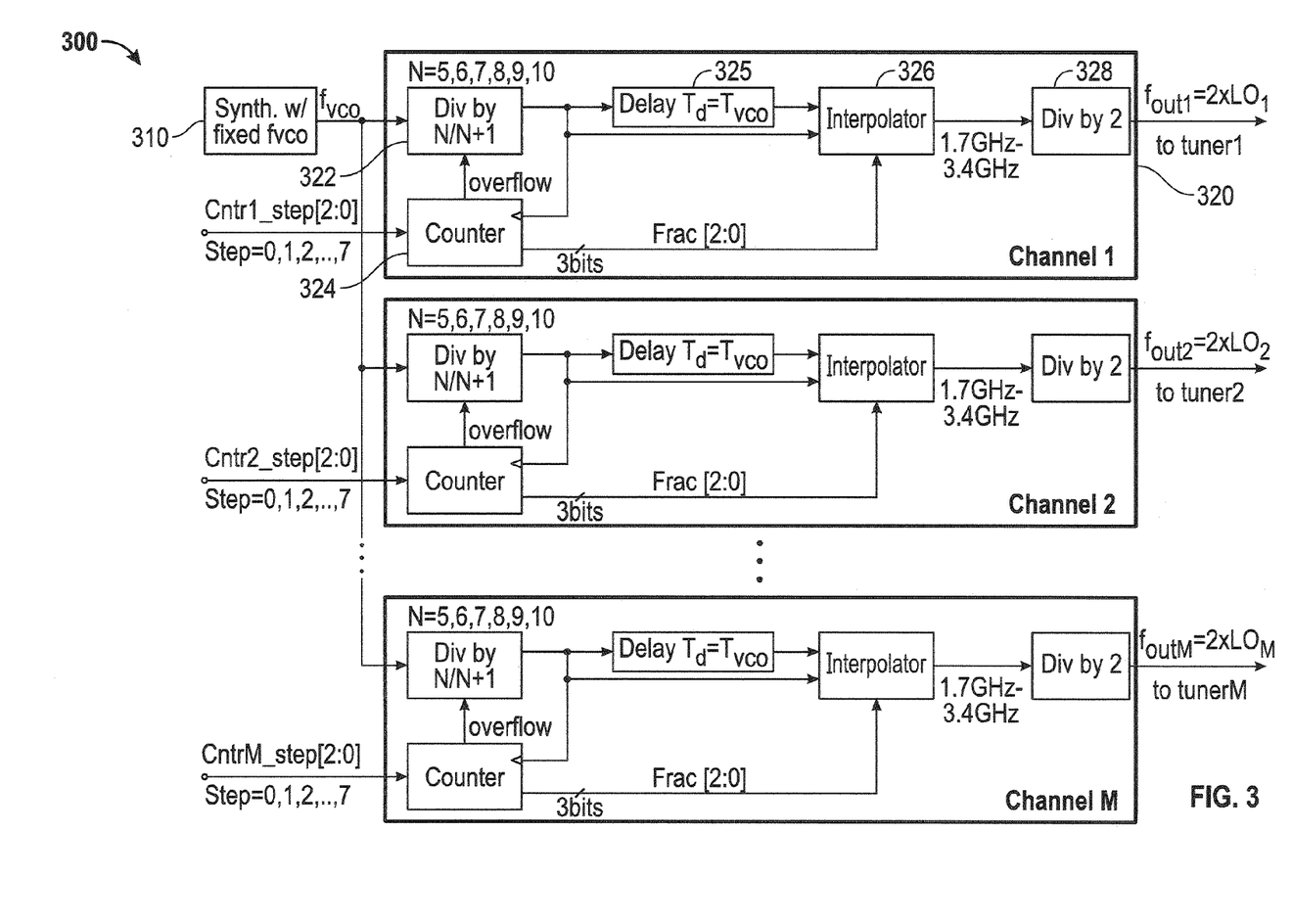
FIG. 3 is a block diagram of an interpolative frequency divider arrangement in accordance with an embodiment.

Referring now to FIG. 3, shown is a block diagram of an interpolative divider arrangement in accordance with an embodiment. As shown in FIG. 3, clock generation circuit 300 includes a frequency synthesizer 310. In an embodiment, the frequency synthesizer may be an on or off-chip frequency synthesizer, such as a crystal oscillator or other frequency generation circuitry. As seen, frequency synthesizer 310 generates a VCO frequency $f_{VCO}$ that is provided to the plurality of channels $320_1$-$320_m$. For purposes of discussion, a single channel $320_1$ of the clock generation circuit is described in detail. Understand that in a particular implementation each such divider may be similarly configured (although programmed with different divide ratios while in operation).

In general, an interpolative divider uses an integer divider for the integer portion of the divider ratio. Then the fractional portion is provided by interpolating one VCO period. So if one wants to divide by 5.375, the edges at the LO output are at 5.375T, 10.75T, 16.125T, 21.5T, 26.875T, 32.25T, 37.625T, 43T, where T is one VCO clock period. So the fractional parts provided by the interpolator divider are 0.375T, 0.75T, 0.125T, 0.5T, 0.875T, 0.25T, 0.625T and 0 and so on. The divider settings on the other hand would be 5T, 5T, 6T (transition between 16.125T-10.75T), 5T, 5T, 6T (transition between 26.875T-32.25T), 5T, 6T (transition between 37.625T-43T), and so on. The fractional part may be provided by a counter with a step size of 0.375. And every time the counter overflows, the divider is configured as a divide-by-6 divider.

As seen, the incoming fixed VCO frequency is provided to a divider 322. In various embodiments, this divider may be a controllable or programmable divider that is controlled to divide by N or N+1, where N is a programmable number and represents the integer portion of the LO divider ratio. In a particular embodiment, N may be programmed to be between 5 and 10. In general, divider 322 operates to divide the VCO frequency signal by this value N. However, upon receipt of a control signal (which in an embodiment is an overflow signal) from a counter 324, divider 322 operates to divide the VCO frequency signal by N+1. Thus in operation, a number of divide cycles occur during which the division is by N and one or more divide cycles occur during which the division is by N+1. For example, in every eight cycles there will be k cycles for which the divider is configured as divide-by-(N+1) and (8−k) cycles for which the divider is configured as divide-by-N. Thus the overall divider ratio is N+(k/8), k=0, 1, 2, . . . , 7.

Still referring to FIG. 3, counter 324 is configured to count to a value set by a step signal received from the MCU. This step value is based on the given RF frequency. In operation, counter 324 generates a three bit output count value FRAC [2:0]. Note that counter 324 is clocked by the output of divider 322. This output of the divider is further provided to a delay element 325 that has a delay corresponding to a period of the VCO frequency ($T_{vco}$).

The divided VCO frequency signal output by divider 322 and the delayed version from delay element 325 are provided to an interpolator 326, which in an embodiment may be a multi-level phase interpolator that interpolates between these two clock pulse values to generate an interpolated output signal. This interpolated output signal in turn is provided to another divider, namely a divide by two divider 328, in the embodiment of FIG. 3.

This resulting LO frequency signal is provided to the corresponding mixer of the given channel to thus enable the received RF signal to be downconverted to a given (e.g., IF) frequency based on this LO frequency signal. Although shown at this high level in the embodiment of FIG. 3, understand that other implementations are possible.

Figure 4:
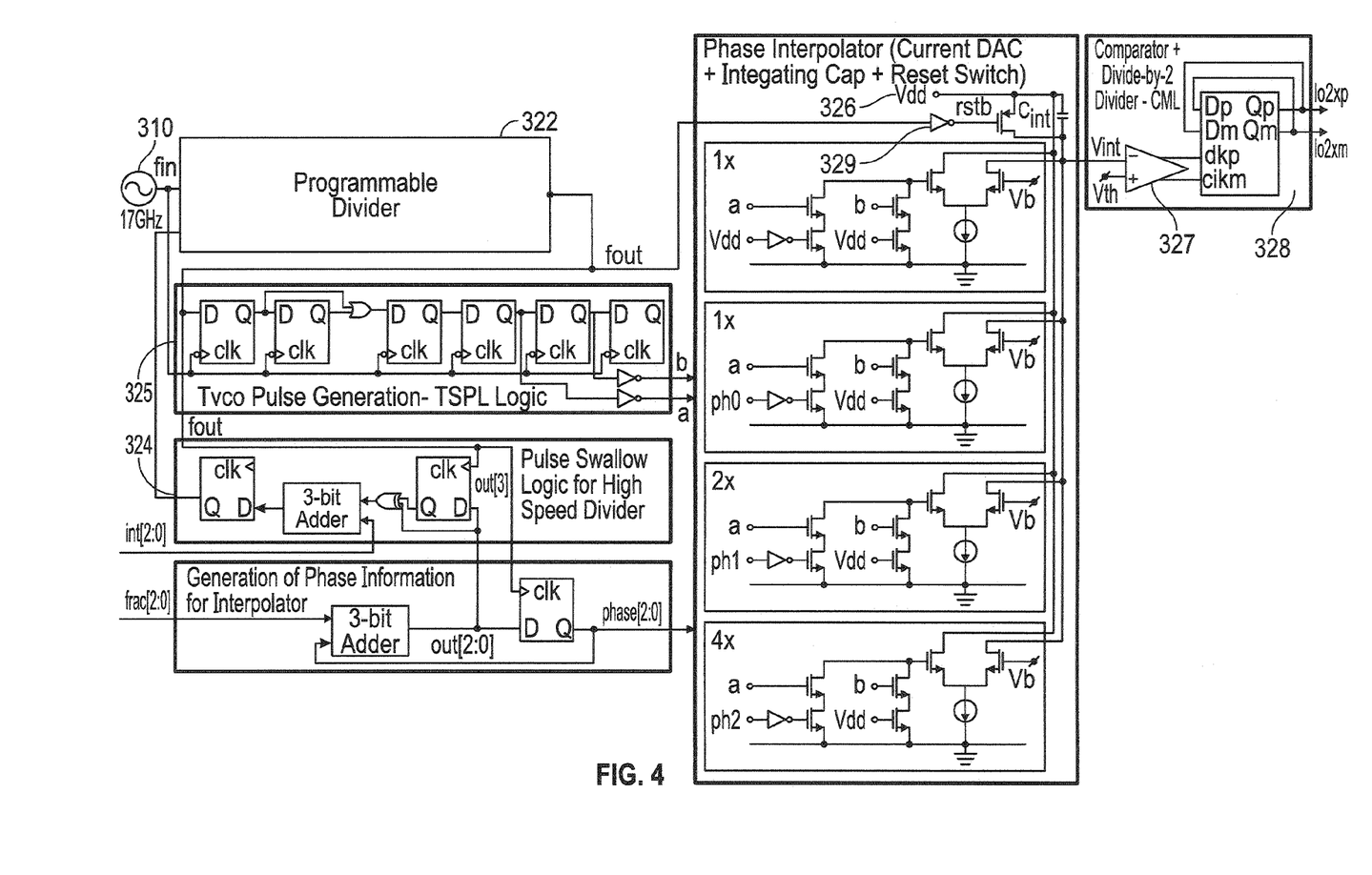
FIG. 4 is a schematic diagram of an interpolative frequency divider in accordance with one embodiment.

Referring now to FIG. 4, shown is a schematic diagram of an interpolative frequency divider in accordance with one embodiment. In the embodiment shown in FIG. 4, divider 320 is configured to receive a VCO frequency from a synthesizer 310. More specifically, a divider 322 may include a plurality of programmable dividers to generate a desired number N for the frequency divider. In turn, the resulting divided VCO frequency signal is provided to a delay element 325 and a phase interpolator 326.

As seen, phase interpolator 326 includes a plurality of current DACs, each of which is of a particular weighted value. In various embodiments, phase interpolator 326 is implemented using binary-weighted DACs as part of integrators. In a particular embodiment, a 16-level interpolator may be provided. However, for most operation scenarios, this interpolator is configured to operate as an 8-level interpolator.

As seen, the current DACs couple to an integrating capacitor $C_{int}$ having a voltage controlled by a reset switch (triggered by an output of an inverter 329), that is controlled by the divided VCO frequency signal output from divider 322. In turn, each of the current DACs receives a pair of clock pulses A and B via delay element 325 and a phase count value from counter 324, which acts as a control input. Note that these clock pulses A and B have a delay with respect to each other of one period of the reference clock signal. Stated another way, clock pulse B trails clock pulse A by a single period of the reference clock signal fin. Thus phase interpolator 326 interpolates between these two clock edges. There are two integrating phases in the interpolator. In the first phase, the integrating capacitor is charged with a current provided by the DAC depending on the DAC input word for a duration equal to one period of the reference clock. Then during the second phase, the DAC provides the full scale current. Once the voltage across the integrating capacitor reaches the threshold value, then the voltage across the capacitor is reset to make it ready for the next interpolation. Thus, the interpolation ratio is determined by the amount of current provided by the current DAC during the first integrating phase, as seen in FIG. 4. Note that the current DACs of phase interpolator 326 integrate charge with a fractional current to realize the voltage stored in the integrating capacitor. In an embodiment having an 8-level phase interpolator, a pair of 1× current DACs, a single 2× current DAC, and a 4×DAC may be provided. The resulting voltage stored in capacitor $C_{int}$ is compared to a threshold voltage in a comparator 327, the output of which clocks an additional divider 328, namely a divide by two divider in order to remove the edge, which is not interpolated.

Figure 5:
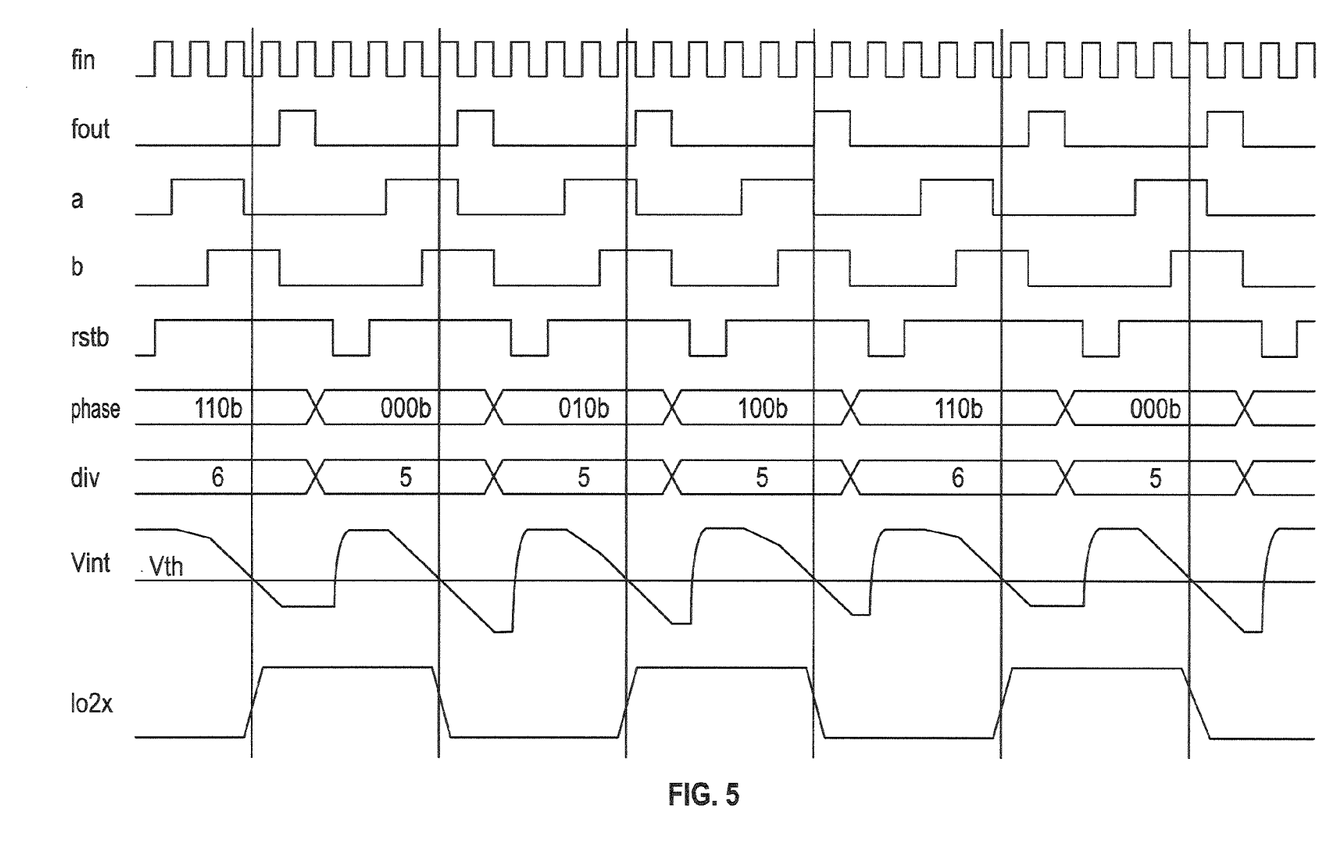
FIG. 5 is a timing diagram illustrating generation of a local oscillator signal using an interpolative divider in accordance with an embodiment.
Figure 6:
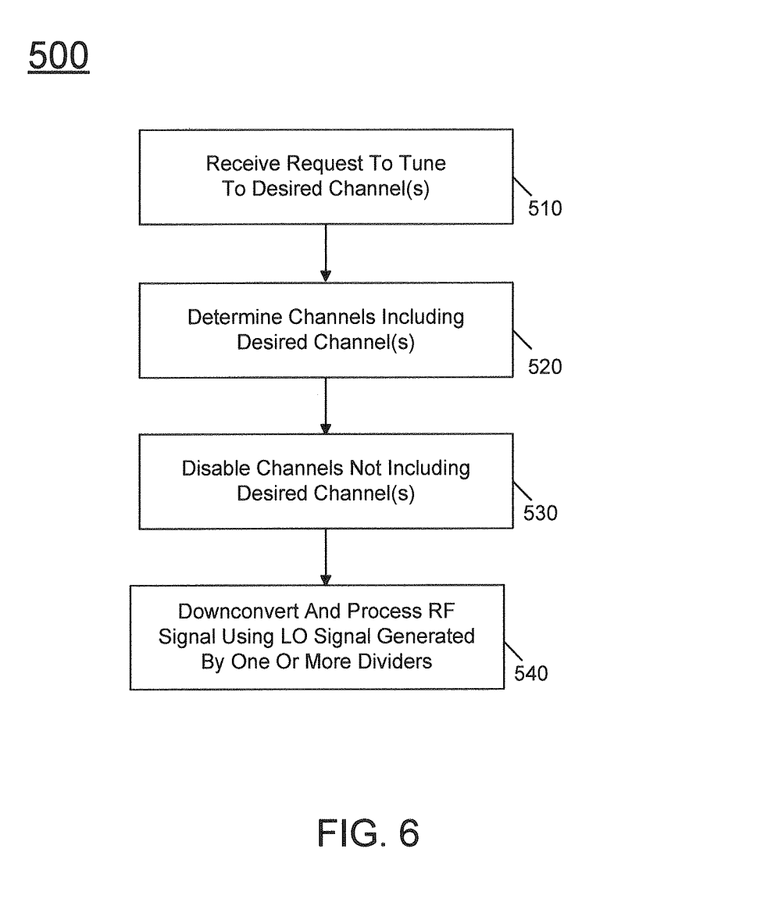
FIG. 6 is a flow diagram of a method of operating a multi-tuner architecture in accordance with an embodiment.

Referring now to FIG. 5, shown is a timing diagram, illustrating generation of a LO signal using an interpolative divider in accordance with an embodiment. As shown in FIG. 6, a LO signal (lo2x, which is the output of divider 328 of FIG. 4) results from an incoming reference clock signal (fin), which in the illustration of FIG. 4 is a 17 GHz reference clock signal.

The illustration shown in FIG. 5 is of operations performed to realize a divide by 5.25 operation. Because an integer-based divider cannot perform fractional divisions, an interpolative divider as in FIG. 4 can realize the desired divide by ratio. As seen, the output of divider 322 is of a variable ratio. Namely, the divide by ratio varies from 5 to 6 in a manner such that the resulting interpolated value meets the desired divide by ratio of 5.25.

Note that the clock pulse signals from delay element 325 (a and b) are provided as inputs into phase interpolator 326, as is the divided frequency signal fout. In phase interpolator 326, this signal is inverted and delayed to generate a reset signal provided to a reset switch of the phase interpolator. In turn, the control of the divide by ratio is by input of a phase control signal that in turn is propagated to control the weightings of the current DACs of phase interpolator 326. The outputs of the individual current DACs are summed to generate an integrating voltage (Vint) via the integrating capacitor of phase interpolator 326.

Then this integrating voltage is compared to a threshold voltage (Vth) in comparator 327 to thus generate a comparison output that in turn clocks divider 328, generating the realized LO signal. Although shown with this particular example, understand that different examples and different values can be used to accommodate other divide ratios.

Note that it is possible for phase spurs to be introduced in interpolative dividers because of interpolator DAC integral nonlinearity (INL) due to DAC unit cell mismatch currents and mismatches in the block path that controls the switching of DAC cells. However, one can show that generated spurs are always at the harmonics of $M/8*fvco/(N+M8)=M*LO/2$. Here it is assumed that there are two divide by two dividers following the interpolator, one immediately following the interpolator to remove the non-interpolated edges, and another divider in the mixer, such that the LO signal is LO= $(fvco/(N+M/8))/4$.

At UHF frequencies, the spurs are located at half the LO frequencies for M=1, 3, 5, 7. A tracking filter in the receiver signal processing path for UHF channels provides at least 20 dB attenuation for blockers at ½ of the LO frequency. For frequencies below UHF, the receiver may switch to an N-phase mixer (where N is an even number selected from 8-12-16-20-24, where the spurs disappear owing to the presence of extra divide-by-2 dividers.

Thus the interpolative divider operates such that division is by a first integer ratio for some number of reference clock signals (corresponding to a given number of divider cycles), and then division is by a second integer ratio for a different number of reference clock signals (for a single divider cycle). The result is thus an interpolation of one period of the reference clock signal to obtain a desired output clock signal, which may be a divide by a fractional amount. Note that the interpolator enables edge transitions to occur at a fractional ratio of the reference period, when necessary. Otherwise, a divider whose divider value is changed between N and N+1 for a certain number of reference cycles would still implement a fractional divider, but the output would have many spurs, as many of the edges would not be at the right instant.

In an embodiment, the interpolative divider may be of low resolution such that design constraints are relaxed and a low power low complexity divider is realized. Although the scope is not limited in this regard, in an embodiment an 8-level interpolator may be provided. Also, the resolution may be kept low to prevent spurs from being closer the LO carrier. For example, switching to a 16-level interpolator would cause the spurs to be located at $M/16*fvco/(N+M/16)=M*LO/4$, which would cause the spurs for UHF to move closer to LO (at LO/4 offset for M=1). This would then degrade the undesired-to-desired signal power ratio (U/D) performance at LO/4 offset frequencies since tracking filters would provide less attenuation to the blocker. However, as discussed further below, to handle receipt of certain analog signals, a 16-level interpolator (which is still of relatively low power and low complexity) is provided. However, for receipt and processing of digital signals and receipt and processing of many analog signals, the 16-level interpolator can be configured to operate as an 8-level interpolator.

Furthermore, by using an interpolative divider in accordance with an embodiment, for a given desired channel of reception, a fixed divide ratio is established. That is, although the interpolative divider performs a series of multiple divide by N operations and a series of multiple divide by N+1 operations, the resulting output is of a fixed divide ratio.

And, any spur that is generated due to the interpolative divider operation is placed in a specific location that may be very far away from a frequency of interest. For example, as described herein embodiments enable location of a LO spur to be outside a frequency band of interest (far away from a channel of interest) and far away from a given LO frequency. For example, as described herein for interpolative divider ratios that even generate a spur, the spur location can be from 200-400 MHz away from a desired frequency channel and as such, the impact of these spurs can be easily managed with the blocker attenuation provided by tracking filters owing to the far proximity of the spurs to LO carrier. That is, in various embodiments rather than spreading noise energy due to constant changing of divide ratios, here a fixed divide ratio for a given desired channel is provided such that the spur generated in the interpolative divider is located at a specific and known frequency location, which is far away from the desired signal channel. Such spur does not degrade the tuner's blocker handling capability owing to the far proximity of its location with respect to the LO carrier.

Note that the only time that the fixed divide ratio for a given interpolative divider is changed is on a change to a desired channel, such as when a user selects a new television channel for tuning.

To keep divider spurs away from LO carrier, the interpolation levels are a minimized number. An 8-level interpolator provides divider ratios of 2×2×(5, 5.125, 5.250, etc.). So the effective total divider values become 20, 20.5, 21, 21.5, and so forth.

Referring now to FIG. 6, shown is a flow diagram of a method of operating a multi-tuner architecture in accordance with an embodiment. As shown in FIG. 6, method 500 can be performed in a controller such as a microcontroller that may be included within or coupled to clock generation circuitry of the multi-tuner. As seen, method 500 begins by receiving an incoming request to tune to one or more desired channels (block 510). This request may be responsive to a user input to tune to a desired TV channel, either for viewing or for recording and storage of a program in a DVR or other storage device. Note that multiple channels may be selected. For example in an implementation of a multi-tuner architecture that is incorporated in a whole house DVR or other entertainment control system, users in different locations of the house, accessing different devices, all may request a different given channel within the cable spectrum at the same time, and using an embodiment of the present invention, the multi-tuner architecture can receive and process all such channels.

Next, control passes to block 520 where it can be determined the channels of the multi-tuner that include these desired channels. More specifically, depending upon the frequency within the cable spectrum at which these television channels are located, the controller can determine which of the multiple channels of the multi-tuner architecture are to be used to process the incoming RF signal.

As only one or a few channels are needed to process a given portion of the cable spectrum since the cable spectrum is separated into multiple different frequency bands according to an embodiment, at block 530 the channels of the multi-tuner that do not include the desired channels can be disabled. In an embodiment, this determination may be based on a table that maps a requested TV channel with a given channel or tuner of the multi-tuner architecture. In an embodiment, the controller can send a power control signal to the circuitry of these channels to power down.

By disabling such channels that are not involved in processing of the desired channels, power consumption can be reduced. In an implementation in which only a single channel is to be powered on to process a single desired channel, significant power savings can be achieved.

As further illustrated in FIG. 6, for the enabled one or more channels processing including front end processing, downconversion, and other processing can be performed to obtain a digital signal that can be sent for further processing such as demodulation and so forth (block 540).

Note that the method of FIG. 6 can be performed in various locations within a tuner such as MCU or other control logic, either within the clock generation circuitry or coupled thereto. And of course although shown in this particular implementation, understand that other alternatives are possible.

Figure 7:
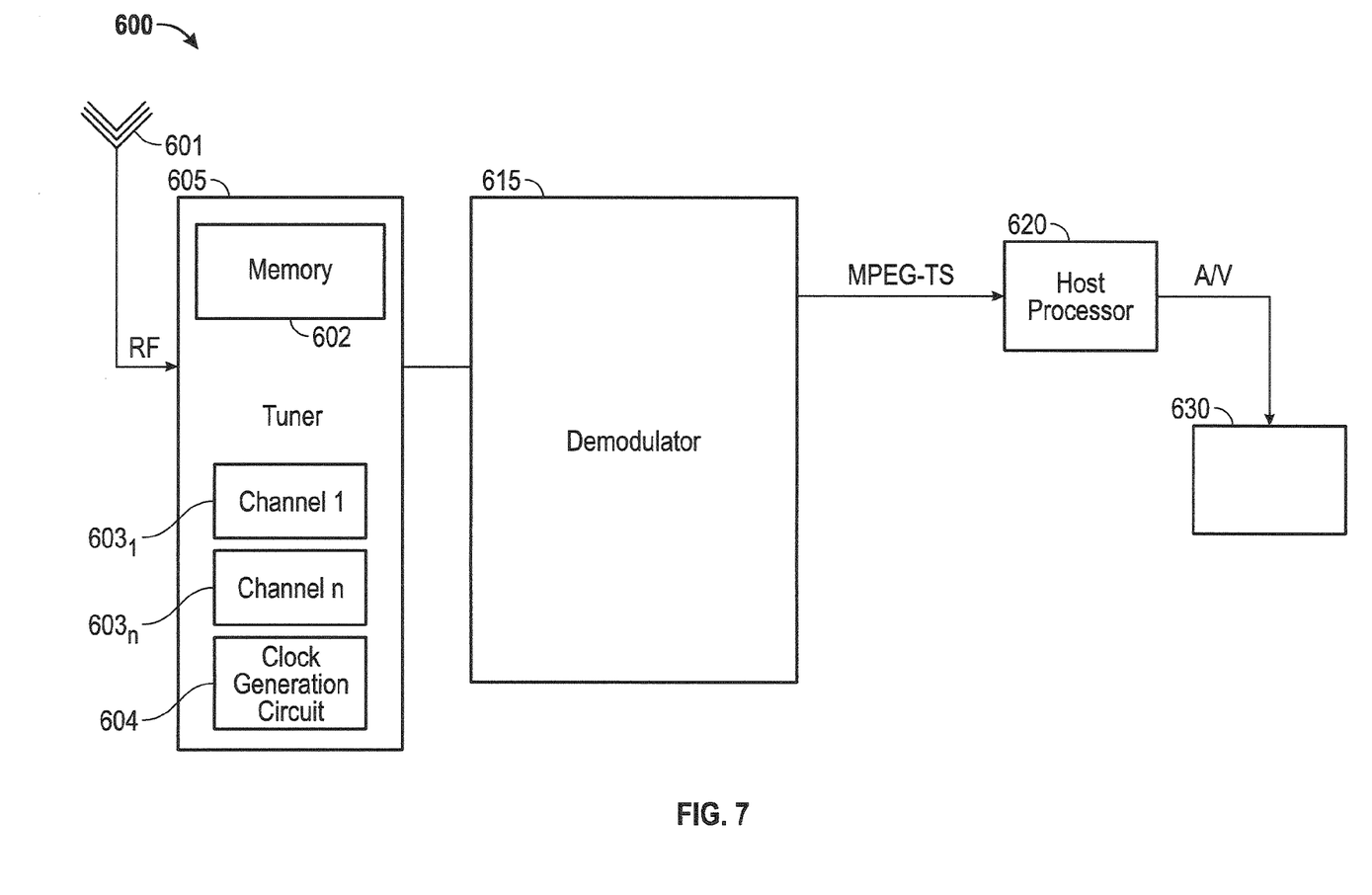
FIG. 7 is a block diagram of a system in accordance with one embodiment.

Embodiments may be implemented in many different system types, such as set-top boxes, high definition or standard digital televisions, and so forth. Some applications may be implemented in a mixed signal circuit that includes both analog and digital circuitry. Referring now to FIG. 7, shown is a block diagram of a system in accordance with one embodiment. As shown in FIG. 7, system 600 may include a television that is coupled to receive a RF signal from an antenna source 601 such as an over-the-air antenna. In addition, a television may further provide for input from additional sources, including cable distribution. The incoming RF signal may be provided to a tuner 605 which may be, in one embodiment a single-chip tuner including a plurality of tuners as described herein. As seen, tuner 605 may include a memory 602 to store executable instructions and a plurality of tuner channels $603_{1-n}$, each of which may include various analog front end circuitry and a wideband ADC. As further seen, tuner 605 also includes a clock generation circuit 604 including a single frequency synthesizer and a plurality of interpolative dividers as described herein.

The incoming RF signal is thus provided to tuner 605 for tuning to one or more desired signal channels. Tuner channels may include various circuitry. For example, in one embodiment each channel 603 may include an amplifier having an output coupled to a fixed bandpass filter. In turn the filtered output of this bandpass filter is coupled to a mixer. In turn, the mixer downconverts the incoming RF signal to an IF output, which may be further processed (e.g., amplified and filtered) via a signal processing path, and finally digitized in a wideband ADC.

Referring still to FIG. 7, the digitized output of these ADCs of tuner 605 may be provided to additional processing circuitry including a demodulator circuit 615, which may demodulate the incoming digitized signals. The output of demodulator 615 may correspond to a transport stream such as an MPEG-TS that is provided to a host processor 620 for further processing into an audio visual signal that may be provided to a display 630, such as a computer monitor, flat panel television or other such display.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:
1. An apparatus comprising:
a splitter to receive a radio frequency (RF) signal that provides a cable spectrum and to provide the RF signal to a plurality of channels each to process a band of a predetermined width of the cable spectrum, wherein each of the plurality of channels comprises:
a first amplifier to amplify the RF signal;
a bandpass filter fixed at a predetermined center frequency to pass the band of the predetermined width of the cable spectrum;
a mixer to downconvert the amplified RF signal to a second frequency signal using a local oscillator (LO) signal, each of the plurality of channels configured to receive a different LO signal;
a second filter to filter the second frequency signal; and a digitizer to digitize the filtered second frequency signal; and a clock generation circuit including a frequency synthesizer to generate a reference clock signal, a plurality of first dividers and a plurality of interpolative dividers, each of the plurality of first dividers to generate a corresponding LO signal from the reference clock signal according to an integer ratio and to provide the corresponding LO signal to the mixer of at least one of the plurality of channels, the plurality of interpolative dividers to generate a corresponding LO signal from the reference clock signal according to a fractional ratio and to provide the corresponding LO signal to the mixer of at least one of the plurality of channels.

2. The apparatus of claim 1, wherein the apparatus comprises a multi-tuner circuit configured on a single semiconductor die.

3. The apparatus of claim 2, wherein the multi-tuner circuit is configured to process and digitize the entire cable spectrum.

4. The apparatus of claim 2, further comprising a controller coupled to the multi-tuner circuit to cause at least one of the channels to be powered off when a desired channel is not within the band of the predetermined width of the at least one of the channels.

5. The apparatus of claim 1, wherein the clock generation circuit comprises a controller coupled to the plurality of interpolative dividers, wherein the controller is to control a value of the LO signal output by each of the plurality of interpolative dividers to cause downconversion of the amplified RF signal to DC with a predetermined bandwidth, wherein a resolution of the interpolative divider is limited to cause spurs generated in the interpolative divider to be maintained away from the LO signal.

6. The apparatus of claim 5, wherein the controller is to configure a first interpolative divider to operate at a fixed divide ratio.

7. The apparatus of claim 1, wherein the number of the plurality of first dividers and the number of the plurality of interpolative dividers is less than the number of the plurality of channels.

8. The apparatus of claim 1, wherein each of the plurality of channels further comprises a second amplifier coupled between the mixer and the second filter.

9. The apparatus of claim 8, wherein the second filter comprises a low pass filter.

10. The apparatus of claim 1, wherein the digitizer comprises a wide band continuous time delta-sigma modulator.

11. The apparatus of claim 10, wherein the wide band continuous time delta-sigma modulator comprises a multi-bit quantizer.

12. The apparatus of claim 1, further comprising a plurality of splitters each to receive the RF signal and to provide the RF signal to a portion of the plurality of channels.

13. A system comprising:

an integrated circuit (IC) multi-tuner circuit having a first semiconductor die including a first tuner to receive and process a first band of a predetermined width of a cable spectrum provided in a radio frequency (RF) signal to output a first digitized signal and a second tuner to receive and process a second band of a predetermined width of the cable spectrum provided in the RF signal to output a second digitized signal; and a clock generation circuit including a frequency synthesizer to generate a reference clock signal, a first divider and an interpolative divider, the first divider to generate a corresponding local oscillator (LO) signal from the reference clock signal according to an integer ratio and to provide the corresponding LO signal to a mixer of one of the first and second tuners, the interpolative divider to generate a corresponding LO signal from the reference clock signal according to a fractional ratio and to provide the corresponding LO signal to a mixer of the other of the first and second tuners.

14. The system of claim 13, wherein the first tuner comprises:

a first amplifier to amplify the RF signal;

a bandpass filter fixed at a predetermined center frequency to pass the first band of the predetermined width of the cable spectrum;

the mixer to downconvert the amplified RF signal to a second frequency signal using the corresponding LO signal;

a second filter to filter the downconverted second frequency signal; and a digitizer to output the first digitized signal.

15. The system of claim 14, wherein the digitizer comprises a wide band continuous time delta-sigma modulator with a multi-bit quantizer.

16. The system of claim 13, further comprising a splitter to receive the RF signal and to provide the RF signal to the first and second tuners.

17. The system of claim 13, further comprising a controller to cause the second tuner to be powered off when a desired television channel is not within the second band of the predetermined width.

18. A method comprising:

receiving a request to tune to a first desired television channel of a cable spectrum provided in a radio frequency (RF) signal received in a multi-tuner circuit, the multi-tuner circuit including a splitter to receive the RF signal that provides the cable spectrum and to provide the RF signal to a plurality of channels of the multi-tuner circuit each to process a band of a predetermined width of the cable spectrum, the multi-tuner circuit further including a frequency synthesizer to generate a reference clock signal, a plurality of first dividers and a plurality of interpolative dividers, each of the plurality of first dividers to generate a corresponding LO signal from the reference clock signal according to an integer ratio and to provide the corresponding LO signal to a mixer of at least one of the plurality of channels, the plurality of interpolative dividers to generate a corresponding LO signal from the reference clock signal according to a fractional ratio and to provide the corresponding LO signal to a mixer of at least one of the plurality of channels;

determining a channel of the plurality of channels including the first desired television channel;

disabling the plurality of channels other than the determined channel; and processing the RF signal in the determined channel.

19. The method of claim 18, further comprising downconverting the RF signal in the determined channel using the LO signal generated by one of the plurality of first dividers and interpolative dividers.

20. The method of claim 18, further comprising controlling a value of the LO signal output by each of the plurality of interpolative dividers to cause downconversion of the amplified RF signal to DC with a predetermined bandwidth, wherein a resolution of the interpolative divider is limited to cause spurs generated in the interpolative divider to be maintained away from the LO signal.

* * * * *